(12) United States Patent
Kapusta

(10) Patent No.: US 8,390,502 B2
(45) Date of Patent: Mar. 5, 2013

(54) CHARGE REDISTRIBUTION DIGITAL-TO-ANALOG CONVERTER

(75) Inventor: Ronald Kapusta, Bedford, MA (US)

(73) Assignee: Analog Devices, Inc., Norwood, MA (US)

( * ) Notice: Subject to any disclaimer, the term of this patent is extended or adjusted under 35 U.S.C. 154(b) by 82 days.

(21) Appl. No.: 13/069,966

(22) Filed: Mar. 23, 2011

(65) Prior Publication Data
US 2012/0242523 A1 Sep. 27, 2012

(51) Int. Cl.
*H03M 1/12* (2006.01)
(52) U.S. Cl. .............. 341/172; 363/59; 363/60; 363/62; 363/63; 345/87; 345/92; 345/690; 327/536; 327/541; 327/535; 327/306; 323/282; 330/150
(58) Field of Classification Search .......... 341/144–172; 345/690, 87, 92; 323/282; 327/306, 535, 327/536, 541; 330/150; 307/109; 363/59–63
See application file for complete search history.

(56) References Cited

U.S. PATENT DOCUMENTS

| | | | |
|---|---|---|---|
| 3,624,639 A | 11/1971 | Isaacs | |
| 5,621,409 A * | 4/1997 | Cotter et al. | 341/156 |
| 5,680,300 A * | 10/1997 | Szepesi et al. | 363/59 |
| 5,684,487 A * | 11/1997 | Timko | 341/172 |
| 6,271,784 B1 * | 8/2001 | Lynn et al. | 341/150 |
| 6,559,789 B1 * | 5/2003 | Somayajula | 341/172 |
| 6,587,066 B1 * | 7/2003 | Somayajula | 341/172 |
| 6,603,415 B1 * | 8/2003 | Somayajula | 341/118 |
| 7,622,984 B2 * | 11/2009 | Lesso et al. | 327/536 |
| 7,786,916 B2 * | 8/2010 | Quinn et al. | 341/150 |
| 7,796,077 B2 * | 9/2010 | Mitikiri | 341/156 |
| 7,982,520 B2 * | 7/2011 | Kuramochi et al. | 327/306 |
| 7,990,702 B2 * | 8/2011 | Tracy et al. | 361/679.55 |
| 8,004,449 B2 * | 8/2011 | Yoshioka | 341/172 |
| 8,059,021 B2 * | 11/2011 | Kuramochi | 341/150 |
| 8,094,057 B2 * | 1/2012 | Haneda | 341/162 |
| 2008/0150621 A1 * | 6/2008 | Lesso et al. | 327/536 |
| 2009/0009375 A1 | 1/2009 | Mathe et al. | |
| 2009/0066552 A1 | 3/2009 | Quinn et al. | |
| 2009/0236908 A1 | 9/2009 | Park | |
| 2010/0176979 A1 | 7/2010 | Hurrell et al. | |
| 2011/0148499 A1 * | 6/2011 | Kuramochi et al. | 327/306 |
| 2011/0148680 A1 * | 6/2011 | Kuramochi | 341/150 |

OTHER PUBLICATIONS

McCreary et al., "All-MOS Charge Redistribution Analog-to-Digital Conversion Techniques—Part I," IEEE Journal of Solid-State Circuits, vol. 10, No. 6, pp. 371-379, Dec. 1975.
Craninckx et al., "A 65fJ/Conversion-Step 0-to-50MS/s 0-to-0.7mW 9b Charge-Sharing SAR ADC in 90nm Digital CMOS," 2007 IEEE International Solid-State Circuits Conference, Digest of Technical Papers, pp. 246-247,600, Feb. 2007.

(Continued)

*Primary Examiner* — Lam T Mai
(74) *Attorney, Agent, or Firm* — Kenyon & Kenyon LLP

(57) ABSTRACT

Embodiments of the present disclosure may provide a charge redistribution DAC with an on-chip reservoir capacitor to provide charges to the DAC in lieu of traditional external reference voltages. The DAC may include the on-chip reservoir capacitor having a first plate and a second plate, an array of DAC capacitors to generate a DAC output, and an array of switches controlled by a DAC input word to couple the DAC capacitors to the reservoir capacitor. The charge redistribution DAC may further comprise a first switch connecting the first plate to an external terminal for a first external reference voltage, and a second switch connecting the second plate to an external terminal for a second external reference voltage. One embodiment may provide an ADC that includes the charge redistribution DAC.

29 Claims, 8 Drawing Sheets

OTHER PUBLICATIONS van Elzakker et al., "A 10-bit Charge-Redistribution ADC Consuming 1.9 µW at 1 MS/s," IEEE Journal of Solid-State Circuits, vol. 45, No. 5, pp. 1007-1015, May 2010.

International Search Report and Written Opinion of the International Searching Authority in counterpart International application No. PCT/US2012/029920, communication dated Jun. 7, 2012.

* cited by examiner

US 8,390,502 B2

CHARGE REDISTRIBUTION DIGITAL-TO-ANALOG CONVERTER

FIELD OF INVENTION

The present invention relates to signal processors, and more particularly to a charge redistribution digital-to-analog converter (DAC) that may carry on a charge redistribution entirely on an IC chip.

BACKGROUND

Charge redistribution DACs are common in modern integrated circuits, particularly in switched capacitor CMOS designs. They have uses in many applications, including analog-to-digital (ADC) architectures such as pipeline and successive approximation (SAR) ADCs. Depending on the application, key performance metrics can be the linearity of the DAC and its settling speed.

An exemplary 3-bit charge redistribution DAC 100 is shown in FIG. 1. It is composed of a terminating capacitor 102 and an array of binary-weighted capacitors 104.1, 104.2 and 104.3 with respective capacitances of 1C, 1C, 2C and 4C. The DAC input is a 3 bit binary digital word with each bit controlling a respective switch of the switches 106.1, 106.2 and 106.3 connected to the capacitors. The other side of the switches 106.1, 106.2 and 106.3 is connected to a reference voltage $V_{REF}$ or ground GND depending on the corresponding bit of the DAC input word. Typically, a digital "1" controls a corresponding switch to connect to the reference voltage $V_{REF}$ and a digital "0" controls a corresponding switch to connect to the GND. The DAC output is determined by an equation of $V_{out}=V_{REF}*C_{selected}/C_{total}$, in which $C_{selected}$ is the amount of capacitance selected by the DAC word, and $C_{total}$ is the sum of all capacitance in the DAC 100. For example, if the DAC code is 101, the capacitors 104.1 and 104.3 are selected by connecting the switches 106.1 and 106.3 to the reference voltage $V_{REF}$, and the switch 106.2 connects the capacitor 104.2 to the ground GND. The output would be $V_{out}=V_{REF}*(4C+1C)/(4C+2C+1C+1C)=5/8*V_{REF}$.

The reference voltage $V_{REF}$ and ground GND have associated parasitics represented by $L_{PAR1}$ and $L_{PAR2}$. When any one of the DAC capacitors switches from $V_{REF}$ to GND (or vice versa), the voltage at the DAC output will ring for some period of time, depending on characteristics of the parasitics and capacitance of the DAC 100. In a typical integrated circuit, the ringing phenomenon limits the frequency at which the DAC can be driven.

Thus, at high-speeds, the performance of the DAC is often limited by the parasitics inductance. Accordingly, there is a need to improve the speed at which the charge redistribution DAC settles, in particular for a SAR ADC application.

DETAILED DESCRIPTION

Embodiments of the present disclosure may provide a charge redistribution DAC with an on-chip reservoir capacitor to provide charges to the DAC in lieu of traditional external reference voltages. The DAC may include the on-chip reservoir capacitor having a first plate and a second plate, an array of DAC capacitors to generate a DAC output, and an array of switches controlled by a DAC input word to couple the DAC capacitors to the reservoir capacitor. The charge redistribution DAC may further comprise a first switch connecting the first plate to an external terminal for a first external reference voltage, and a second switch connecting the second plate to an external terminal for a second external reference voltage. One embodiment may provide an ADC that includes the charge redistribution DAC.

Another embodiment of the present invention may provide a method for generating a digital-to-analog output for a digital-to-analog converter (DAC). The method may comprise sampling two external reference voltages to an on-chip reservoir capacitor of the DAC. Further, the method may comprise disconnecting the on-chip reservoir capacitor of the DAC from the external reference voltages, and connecting the plurality of DAC capacitors to the on-chip reservoir capacitor according to a DAC input word.

Figure 1:
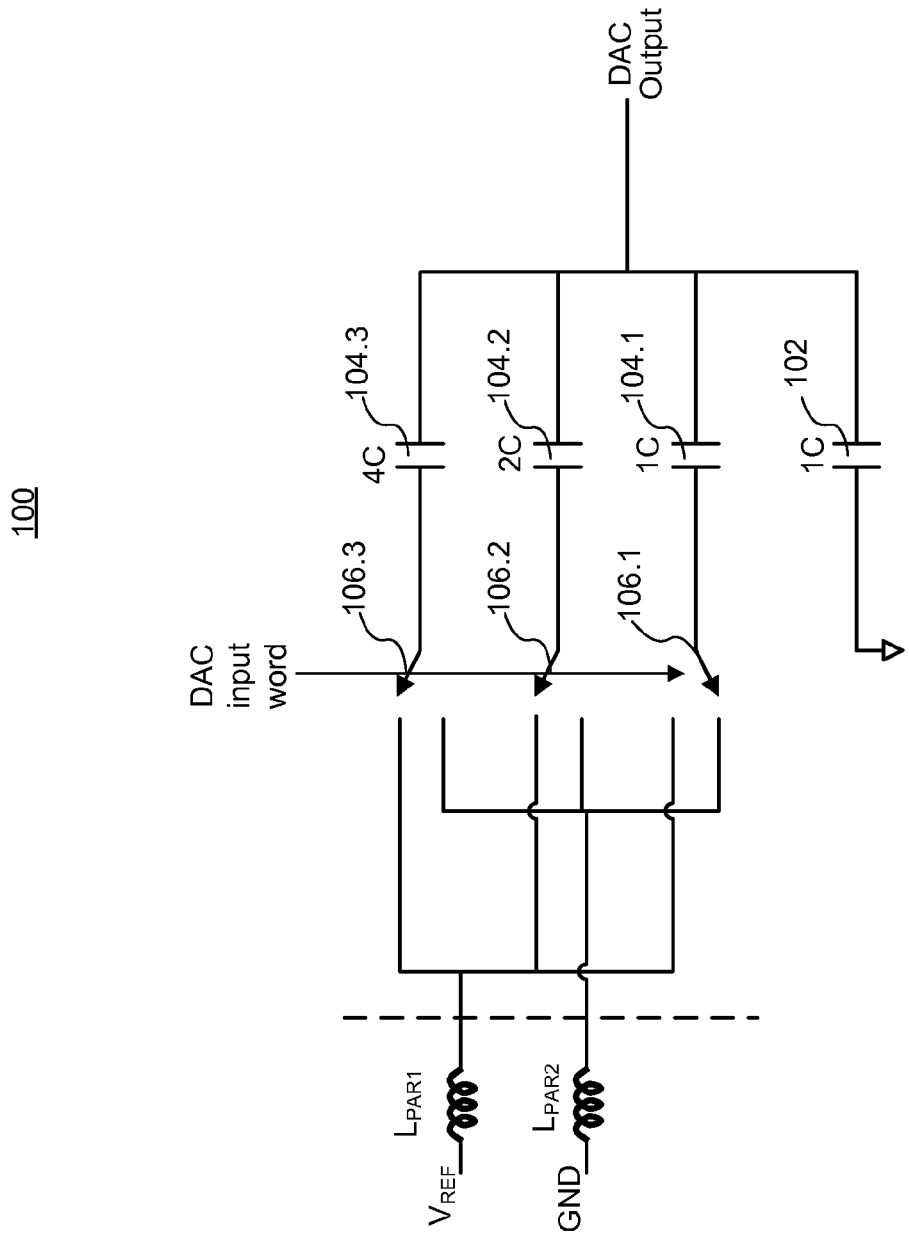
FIG. 1 is a traditional charge redistribution DAC.
Figure 2:
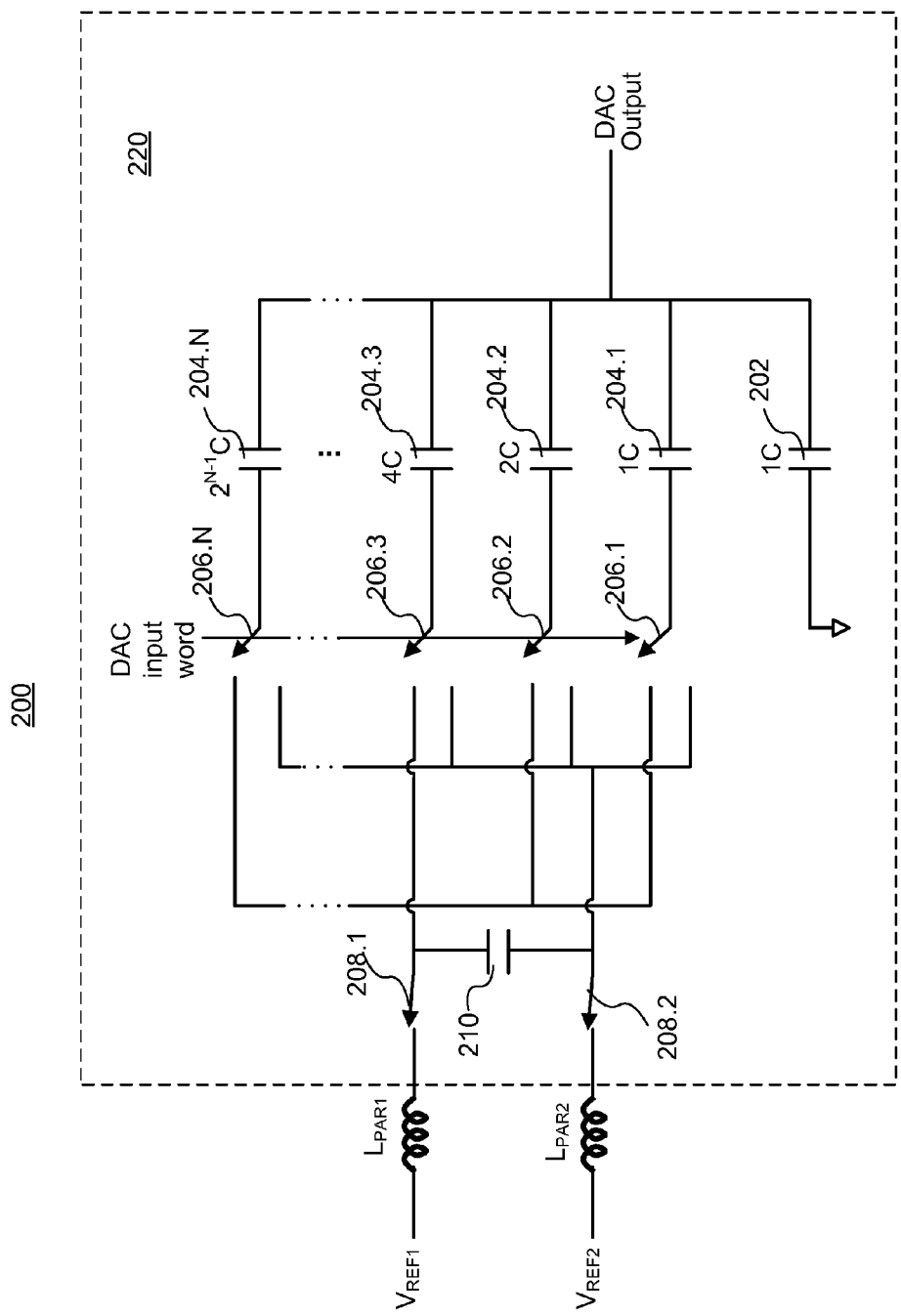
FIG. 2 shows a charge redistribution DAC according to one embodiment of the present invention.

FIG. 2 shows a charge redistribution DAC 200 according to one embodiment of the present invention. The charge redistribution DAC 200 may be a N bit DAC (e.g., N being an integer number larger than one) and comprise a terminating capacitor 202 and an array of binary weighted capacitors 204.1-204.N, and a plurality of switches 206.1-206.N. The charge redistribution DAC 200 may further comprise two switches 208.1 and 208.2, and a reservoir capacitor $C_{RES}$ 210. All of these components of the charge redistribution DAC 200 may be integrated on an IC chip 220 (e.g., on the same die), and the reservoir capacitor $C_{RES}$ 210 may be an on-chip reservoir capacitor.

The reservoir capacitor $C_{RES}$ 210 may have two sides (e.g., two plates) to store electrical charges. The switch 208.1 may have one end coupled to a first side (e.g. a top plate or top side) of the $C_{RES}$ 210 and another end coupled to a first terminal of the IC chip that may be connected to a first reference voltage $V_{REF1}$ during operation. The switch 208.1 thus controls the connection between the first side of the $C_{RES}$ 210 and the first reference voltage $V_{REF1}$. The switch 208.2 may have one end coupled to a second side (e.g., a bottom plate or bottom side) of the $C_{RES}$ 210 and another end coupled to a second terminal of the IC chip that may be connected to a second reference voltage $V_{REF2}$ during operation. The switch 208.2 thus controls the connection between the second side of the $C_{RES}$ 210 and the second reference voltage $V_{REF2}$. Each capacitor 204.1-204.N may be controlled by a respective switch 206.1-206.N to disconnect from the reservoir capacitor $C_{RES}$ 210, or connect to either the first side of the reservoir capacitor $C_{RES}$ 210 or the second side of the reservoir capacitor $C_{RES}$ 210. In one embodiment, the first reference voltage $V_{REF1}$ may have a higher voltage value than the second reference voltage $V_{REF2}$. For example, the first reference voltage may be a positive reference value $V_{REF+}$ (e.g., the positive power supply VDD) and the second reference voltage $V_{REF2}$ may be a positive reference value lower than $V_{REF+}$, or the ground GND, or a negative reference value p $V_{REF-}$ (e.g., negative power supply VSS).

The switches 206.1-206.N may be controlled by a DAC input word that may be a N bit binary digital word with each bit controlling a switch respectively. The switch 206.1 may be controlled by the least significant bit (LSB), and thus the capacitor 204.1 may correspond to the LSB and its capacitance may be a unit capacitance (e.g., 1C). The switch 206.N may be controlled by the most significant bit (MSB), and thus the capacitor 204.N may correspond to the most significant bit (MSB) and its capacitance may be $2^{N-1}$ unit capacitance. Thus, the binary weighted capacitors 204.1-204.N have capacitances of $2^0 C$, $2^1 C$, ... and $2^{N-1} C$ respectively. In one embodiment, the unit capacitance may be any suitable capacitance value.

In one embodiment, the charge redistribution DAC 200 may be part of the integrated circuit (IC) chip 220. The reference voltages $V_{REF1}$ and $V_{REF2}$ may be supplied from outside of the chip 220. The charge redistribution DAC 200 may operate in 2 phases. During an initial action phase, the reservoir capacitor $C_{RES}$ 210 may be connected to the external reference voltages $V_{REF1}$ and $V_{REF2}$, and may sample the reference voltages $V_{REF1}$ and $V_{REF2}$. That is, during this initial phase, the switches 208.1 and 208.2 may connect the first and second sides of the reservoir capacitor $C_{RES}$ 210 to the external voltages $V_{REF1}$ and $V_{REF2}$ respectively. In one embodiment, the switches 206.1, 206.2 and 206.3 may be kept closed for the DAC capacitors 204.1-204.N to be connected to the reservoir capacitor $C_{RES}$ 210 during the initial phase. In another embodiment, the switches 206.1, 206.2 and 206.3 may disconnect the DAC capacitors 204.1-204.N from the reservoir capacitor $C_{RES}$ 210 during the initial phase. In the latter embodiment, any ringing due to parasitics may have no effect on any of the DAC capacitors 204.1-204.N.

Figure 3:
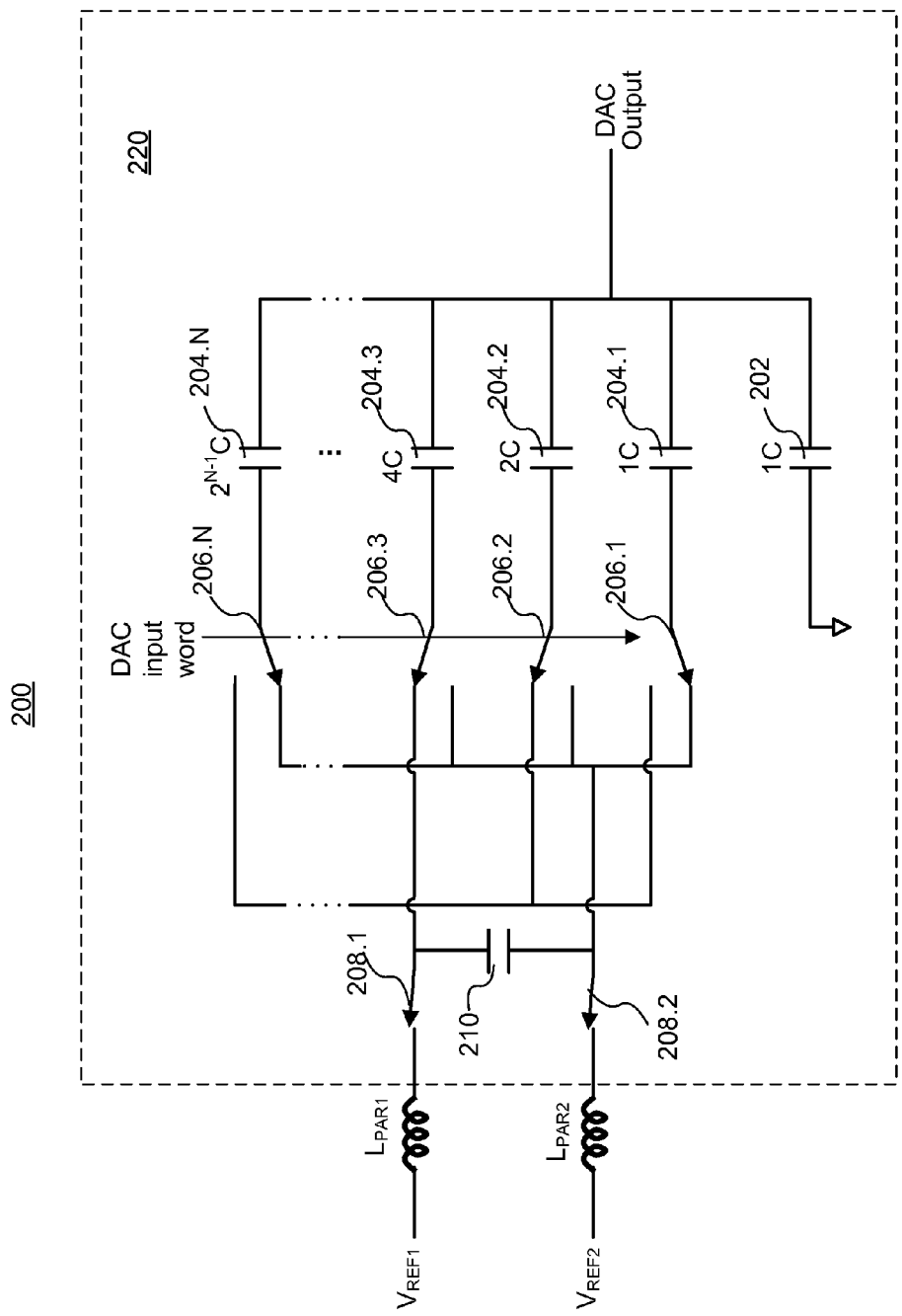
FIG. 3 shows the charge redistribution DAC of FIG. 2 in a second phase according to an embodiment of the present invention.

FIG. 3 shows the charge redistribution DAC 200 in a second phase according to an embodiment of the present invention. During the second phase, as shown in FIG. 3, the switches 208.1 and 208.2 may disconnect the first and second sides of the reservoir capacitor $C_{RES}$ 210 from the external reference voltages (e.g., disconnecting from the external $V_{REF1}$ and $V_{REF2}$), and thus isolating the charge redistribution DAC 200 from the parasitics. In the second phase, one or more DAC input words may be applied to the switches 206.1-206.N. In each DAC input word, a digital "1" may connect a corresponding DAC capacitor 204 to the first side of the reservoir capacitor $C_{RES}$ 210 and a digital "0" may connect a corresponding DAC capacitor 204 to the second side of the reservoir capacitor $C_{RES}$ 210. For example, the MSB bit of the DAC input word may control the switch 206.N and the LSB bit of the DAC input word may control the switch 206.1. Therefore, all charge redistribution will take place completely on-chip, between the reservoir capacitor $C_{RES}$ 210 and the DAC capacitors 204.1-204.N. Because this charge sharing is on-chip, the DAC 200's performance is not limited by the slow settling response caused by external parasitics, such as stray inductance. In one embodiment, the settling may be limited only by switch on-resistance, which can be very fast in modern IC processes.

As shown in FIGS. 2 and 3, the reservoir capacitor $C_{RES}$ 210 may need to be very large to supply the charge electricity. In one embodiment, to achieve N-bit linearity, the reservoir capacitor $C_{RES}$ 210 may be sized so that:

$$C_{RES} > 2^{2N} * C_{UNIT}$$

where $C_{UNIT}$ is the size of the LSB capacitor (1C as shown in FIGS. 2-3). Accordingly, for moderate to high resolution DACs, the reservoir capacitor $C_{RES}$ according to embodiments of the present invention may be enormous.

During operation, the DAC capacitors 204.1-204.N may have each have one side to be connected to the reservoir capacitor $C_{RES}$ 210 (e.g., either the first or second side). The DAC output may be coupled to the other side of the DAC capacitors 204.1-204.N, and is never directly connected to the reservoir capacitor $C_{RES}$ 210.

Figure 4:
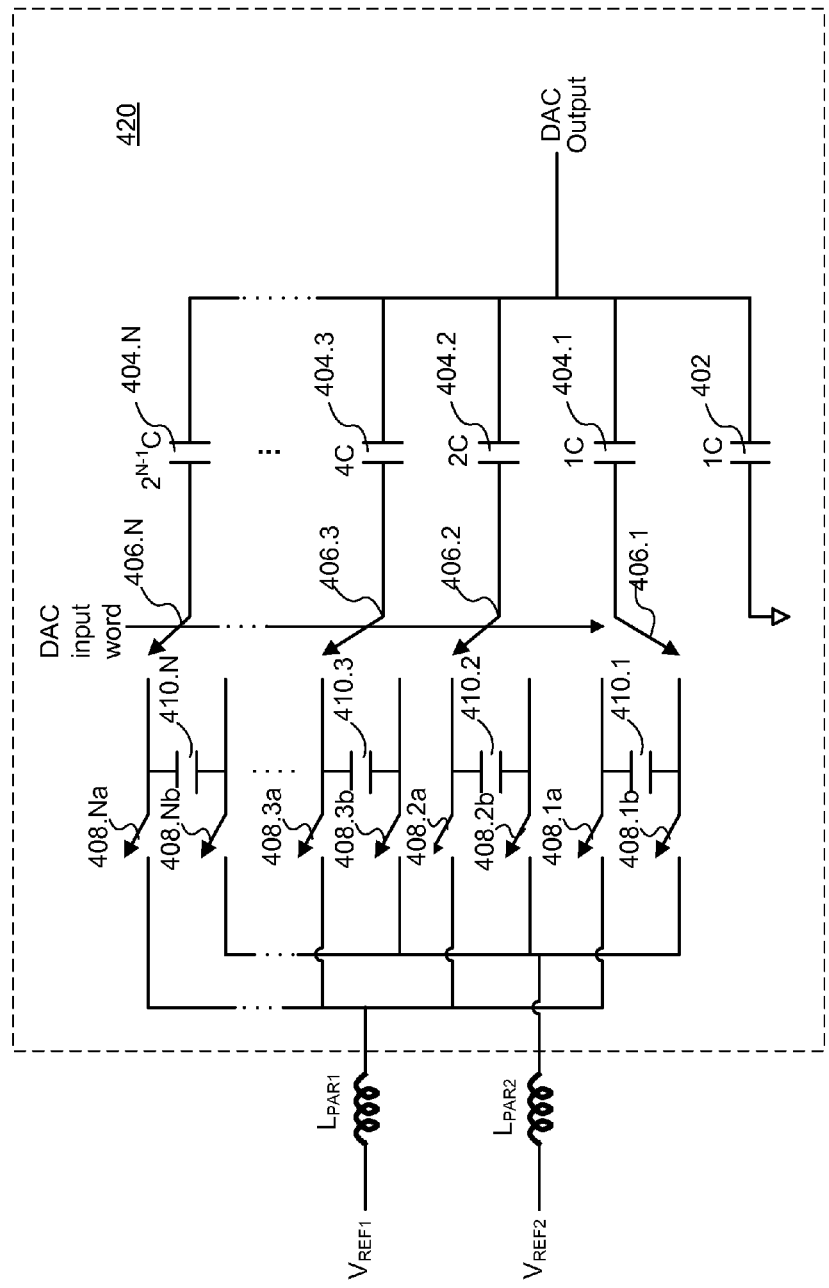
FIG. 4 shows another charge redistribution DAC according to another embodiment of the present invention.

FIG. 4 shows another charge redistribution DAC 400 according to another embodiment of the present invention. The charge redistribution DAC 400 may be a N bit DAC and may comprise a terminating capacitor 402 and an array of binary weighted capacitors 404.1-404.N, and a plurality of switches 406.1-406.N. The charge redistribution DAC 200 may further comprise a plurality of reservoir capacitors $C_{RES}$ 410.1-410.N. The reservoir capacitors $C_{RES}$ 410.1-410.N each may have a first side (e.g., a first plate or top plate) and a second side (e.g., a second plate or bottom plate) connected to external terminals for the reference voltages $V_{REF1}$ and $V_{REF2}$ via switches 408.1a and 408.1b to 408.Na and 408.Nb respectively. Each DAC capacitor 404 may be controlled by a respective switch 406 to disconnect from a respective reservoir capacitor $C_{RES}$ 410 or connect to either the first side or the second side of the respective reservoir capacitor $C_{RES}$ 410. All of these components of the charge redistribution DAC 200, for example, the capacitors (402, 404.1-404.N), switches (406.1-406.N, 408.1a and 408.1b to 408.Na and 408.Nb), reservoir capacitors $C_{RES}$ (410.1-410.N), may be integrated on an IC chip 420 (e.g., on the same die), and the reservoir capacitors $C_{RES}$ (410.1-410.N) may be on-chip reservoir capacitors.

Similar to the charge redistribution DAC 200, the switches 406.1-406.N may be controlled by a N bit DAC input word that may be a binary digital word with each bit controlling a switch. The switch 406.1 may be controlled by the least significant bit (LSB), and thus the capacitor 404.1 may correspond to the LSB and its capacitance may be a unit capacitance (e.g., 1C). The switch 406.N may be controlled by the most significant bit (MSB) and its capacitance may be $2^{N-1}$ unit capacitance. Thus, the binary weighted capacitors 404.1-404.N have capacitances of $2^0 C$, $2^1 C$, ... and $2^{N-1} C$ respectively.

Again, the charge redistribution DAC 400 may be part of the IC chip 420 and the reference voltages $V_{REF1}$ and $V_{REF2}$ may be supplied from outside of the IC chip 420. The charge redistribution DAC 400 may operate in 2 phases. During the first phase, each of the reservoir capacitors $C_{RES}$ 410.1-410.N may be connected to the external reference voltages $V_{REF1}$ and $V_{REF2}$ to sample the reference voltages $V_{REF1}$ and $V_{REF2}$. During this phase, the switches 408.1a-408.Na may connect the first sides of the reservoir capacitors $C_{RES}$ 410.1-410.N to the external $V_{REF1}$ and the switches 408.1b-408.Nb may connect the second sides of the reservoir capacitors $C_{RES}$ 410.1410.N to the $V_{REF2}$. Similar to the charge redistribution DAC 200, in one embodiment, the switches 406.1-406.N may be kept closed for the DAC capacitors 404.1-404.N to be connected to the reservoir capacitor $C_{RES}$ 410 during the first phase. In another embodiment, the switches 406.1-406.N may disconnect the DAC capacitors 404.1-404.N from the reservoir capacitors $C_{RES}$ 410.1-410.N during the first phase. In the latter embodiment, any ringing due to parasitics may have no effect on any of the DAC capacitors 404.1-404.N.

During the second phase, each of the switches 408.1a-408.Na and 408.1b-408.Nb may be disconnected. Thus, first and second plates of the reservoir capacitors $C_{RES}$ 410.1-410.N may be disconnected from the outside of the chip 420 (e.g., disconnecting from the external $V_{REF1}$ and $V_{REF2}$), and thus isolating charge redistribution DAC 400 from the parasitics. In the second phase, one or more DAC input words may be applied to the switches 406.1-406.N. In each DAC input word, a digital "1" may connect a corresponding DAC capacitor 404 to the first side of a corresponding reservoir capacitor $C_{RES}$ 410 and a digital "0" may connect a corresponding DAC capacitor 404 to the second side of a corresponding reservoir capacitor $C_{RES}$ 410. Therefore, all of the charge redistribution will take place completely on-chip, between the reservoir capacitors $C_{RES}$ 410.1-410.N and the DAC capacitors 404.1-404.N.

In one embodiment, each of the reservoir capacitors 410.1-410.N may be sized differently. The LSB reservoir cap 410.1, connected to the 1C DAC cap 404.1, may be the smallest because it is subject to the least charge sharing (1C is the smallest DAC cap) and its significance at the DAC output is also the smallest. The MSB reservoir cap 410.N, connected to the $2^{N-1}$C DAC cap 404.N, may be the largest because it is subject to the most charge sharing ($2^{N-1}$C is the largest DAC cap) and its significance at the DAC output is also the largest. Even the largest reservoir capacitor 410.N may have a capacitance much smaller than the single reservoir capacitor 210. Further, the overall capacitance of 410.1-410.N may be smaller than the capacitance of the single reservoir capacitor 210.

In another embodiment, the number of reservoir capacitors 410 may be less than the number of DAC capacitors 404. That is, an embodiment according to the present invention does not have to have a separate reservoir capacitor for each bit and at least one reservoir capacitor may be shared by two or more DAC capacitors. The charge redistribution DAC 200 may be an example that one reservoir capacitor may be shared by N DAC capacitors.

In one embodiment, not shown, the DAC capacitors of the charge redistribution DAC 400 may be configured in a capacitor split-array.

Figure 5:
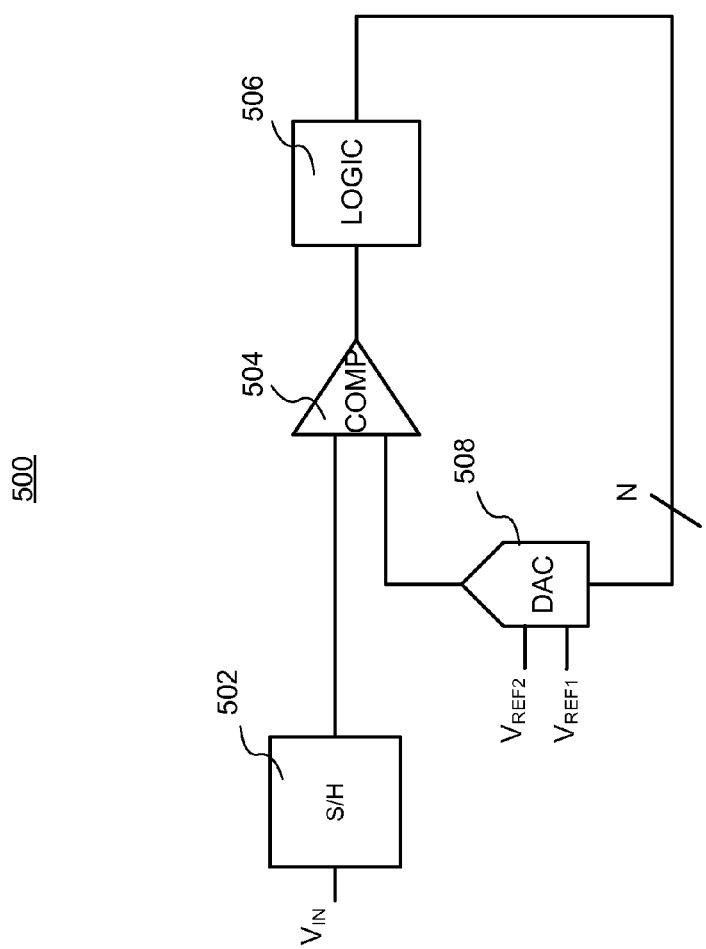
FIG. 5 shows a SAR ADC with a charge redistribution DAC according to an embodiment of the present invention.

FIG. 5 shows a SAR ADC 500 with a charge redistribution DAC according to an embodiment of the present invention. The SAR ADC 500 comprise a sample-and-hold circuit (S/H) 502, a voltage comparator 504, an internal N bit DAC 508 and a digital control logic block 506. During operations, the S/H circuit 502 may acquire an input voltage $V_{in}$ and the analog voltage comparator 504 may compare the input voltage $V_{in}$ to the output of the internal N bit DAC 508. The result of the comparison may be output to the digital control logic block 506, which may supply an approximate digital code of $V_{in}$ to the N bit DAC 508. The approximate digital code of $V_{in}$ may be a N bit control word (e.g., the DAC input word according to an embodiment of the present invention).

The digital control logic block 506 may include a successive approximation register. The SAR ADC 500 may operate as follows. The successive approximation register may be initialized so that the most significant bit (MSB) may be equal to a digital 1. This code may be fed into the DAC 508, which then may supply the analog equivalent of this digital code (e.g., $$\frac{V_{REF1} - V_{REF2}}{2})$$

into the comparator circuit for comparison with the sampled input voltage $V_{in}$. If this analog voltage exceeds $V_{in}$ the comparator 504 may cause the SAR to reset this bit; otherwise, the bit may be left as 1. Then the next bit may set to 1 and the same test may be performed. This binary search may be continued until every bit in the SAR has been tested. The resulting code may be the digital approximation of the sampled input voltage $V_{in}$ and may be finally output by the SAR ADC 500 at the end of the conversion (EOC).

The internal N bit DAC 508 of the SAR ADC 500 may be a N bit charge redistribution DAC according to an embodiment of the invention. Because a SAR makes its bit decisions sequentially in time, improvements to the DAC settling time may have a significant impact on the maximum SAR throughput.

Figure 6:
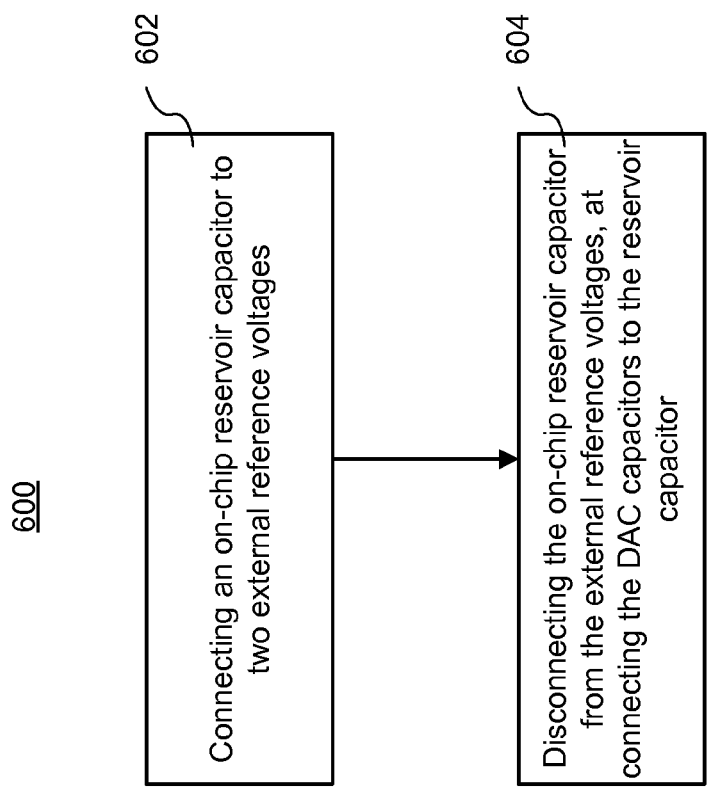
FIG. 6 shows a process of a charge redistribution DAC according to an embodiment of the present invention.

FIG. 6 shows a process 600 for a charge redistribution DAC according to an embodiment of the present invention. The process 600 may start at block 602. At block 602, an on-chip reservoir capacitor of the charge redistribution DAC may be connected to two external reference voltages (e.g., $V_{REF1}$ and $V_{REF2}$). For example, as described with respect to FIGS. 2-4 and 7-8, during a first phase of operation, an on-chip reservoir capacitor of an charge redistribution DAC according to the present invention may be connected to the first and second external reference voltages. Further, during this phase of operation, the DAC capacitors of the charge redistribution DAC may be kept connected to the on chip reservoir capacitor and external reference voltages, or alternatively, kept disconnected from the on chip reservoir capacitor and external reference voltages.

In one embodiment, the charge redistribution DAC may be an internal DAC of an ADC. In this embodiment, the block 602 may be performed while an sample and hold circuit (S/H) of the ADC may be sampling an input voltage $V_{in}$. Thus, an example ADC according to the present invention may have its DAC sample the external reference voltages to an internal reservoir capacitor while the S/H of the ADC samples the input voltage $V_{in}$.

At completion of block 602, the process 604 may proceed to block 604. At block 604, the on-chip reservoir capacitor of the charge redistribution DAC may be disconnected from the external reference voltages, and the DAC capacitors of the charge redistribution DAC may be connected to the reservoir capacitor. For example, as described above with respect to FIGS. 3-4 and 7-8, during a second phase of operations, the on-chip reservoir capacitor of a charge redistribution DAC according to the present invention may be disconnected from the external reference voltage and ground, and the DAC capacitors of the charge redistribution DAC may be connected to the reservoir capacitor according to the DAC input word.

In one embodiment, the charge redistribution DAC may be an internal DAC of an ADC. In this embodiment, the block 604 may be performed after the ADC has completed its sampling of the input voltage $V_{in}$. Further, in this stage of operation, an example ADC according to the present invention may change the DAC code as many times as needed. Thus, the ADC may perform a series of comparison of the sampled input voltage to a plurality of DAC code by changing the DAC input word among a plurality of values. Because the charge is redistributed between the on-chip reservoir capacitor and DAC capacitors, the ADC according to the present invention may improve its performance. It should be noted although blocks 602 and 604 refer to on-chip reservoir capacitor in a singular form, the description is also applicable to the embodiment according to FIGS. 4 and 8, where a plurality of on-chip reservoir capacitors may be used.

Figure 7:
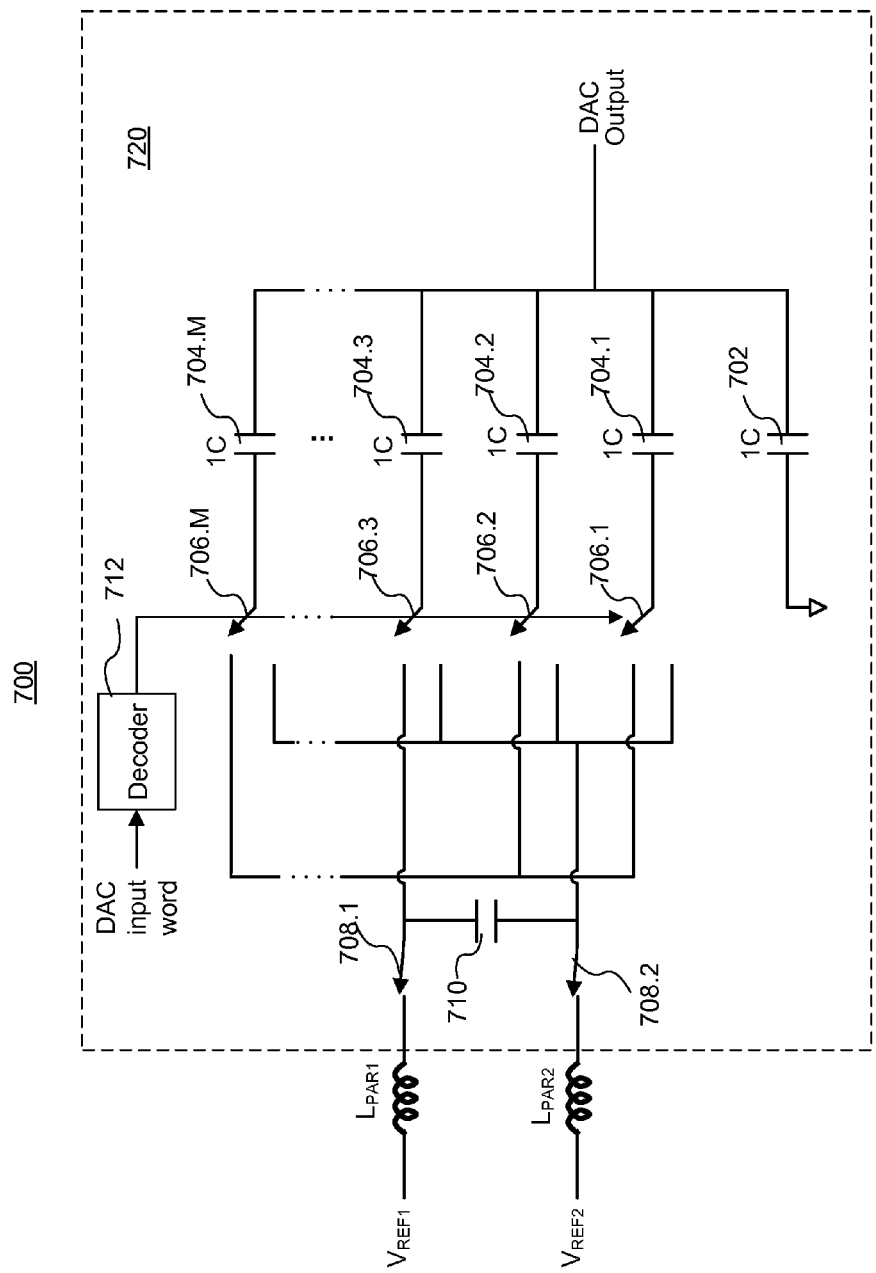
FIG. 7 shows another charge redistribution DAC according to another embodiment of the present invention.

FIG. 7 shows another charge redistribution DAC 700 according to another embodiment of the present invention. The charge redistribution DAC 700 may be a N bit DAC and may comprise a terminating capacitor 702, an array of capacitors 704.1-704.M, a decoder 712 and a plurality of switches 706.1-706.M. In one embodiment, each of the capacitors 704.1-704.M may have a unit capacitance and the number M may be equal to $2^N-1$. The charge redistribution DAC 700 may further comprise two switches 708.1 and 708.2, and a reservoir capacitor $C_{RES}$ 710. All of these components of the charge redistribution DAC 700 may be integrated on an IC chip 720 (e.g., on the same die), and the reservoir capacitor $C_{RES}$ 710 may be an on-chip reservoir capacitor.

The charge redistribution DAC 700 may differ from the charge redistribution DAC 200 by having M ($2^N-1$) capacitors 704.1-704.M each having a unit capacitance and having M switches 706.1-706.M controlled by a decoder 712 that decodes the N bit DAC input word.

The charge redistribution DAC 700 may operate in two phases, similar to the charge redistribution DAC 200. The two switches 708.1, 708.2, and the reservoir capacitor $C_{RES}$ 710 may be similar to the switches 208.1, 208.2 and the reservoir capacitor $C_{RES}$ 210, and operate similarly. During the initial action phase, the switches 706.1-706.M may be connected to or disconnected from the reservoir capacitor $C_{RES}$ 710, also similar to the switches 206.1-206.N for the first phase.

During the second phase, the switches 708.1 and 708.2 may disconnect the first and second sides of the reservoir capacitor $C_{RES}$ 710 from the external reference voltages (e.g., disconnecting from the external $V_{REF1}$ and $V_{REF2}$), and thus isolating the charge redistribution DAC 700 from the parasitics. The decoder 712 may generate control signals for the switches 706.1-706.M based on the DAC input word to connect some of the switches 706.1-706.M to the first side and others to the other side of the reservoir capacitor $C_{RES}$ 710. The DAC input word may be a N bit binary word having a value range of $0 \sim 2^N-1$ (e.g., for N=3, the value range may be 0~7). When the DAC input word has a specific value F, the decoder 712 may select F of M switches to be connected to the first side of the reservoir capacitor $C_{RES}$ 710 and let the remaining (M minus F) switches to be connected to the second side of the reservoir capacitor $C_{RES}$ 710. For example, for N=3 and F=5 (e.g., corresponds to binary DAC input word "101"), of the 7 switches (M=$2^N-1$=7), five (5) may be selected to be connected to the first side of the reservoir capacitor $C_{RES}$ 710, and the remaining two (2) switches may be connected to the second side of the reservoir capacitor $C_{RES}$ 710. In another example, if F is zero, none of the switches 706.1-706.M is selected to be connected to the first side of the reservoir capacitor $C_{RES}$ 710, instead, all of them may be connected to the second side of the reservoir capacitor $C_{RES}$ 710.

In one embodiment, because all DAC capacitors 704.1-704.M may have a unit capacitance, the capacitors 704.1-704.M may be selected indiscriminately during operation to connect to the first side or second side of the reservoir capacitor $C_{RES}$ 710.

Figure 8:
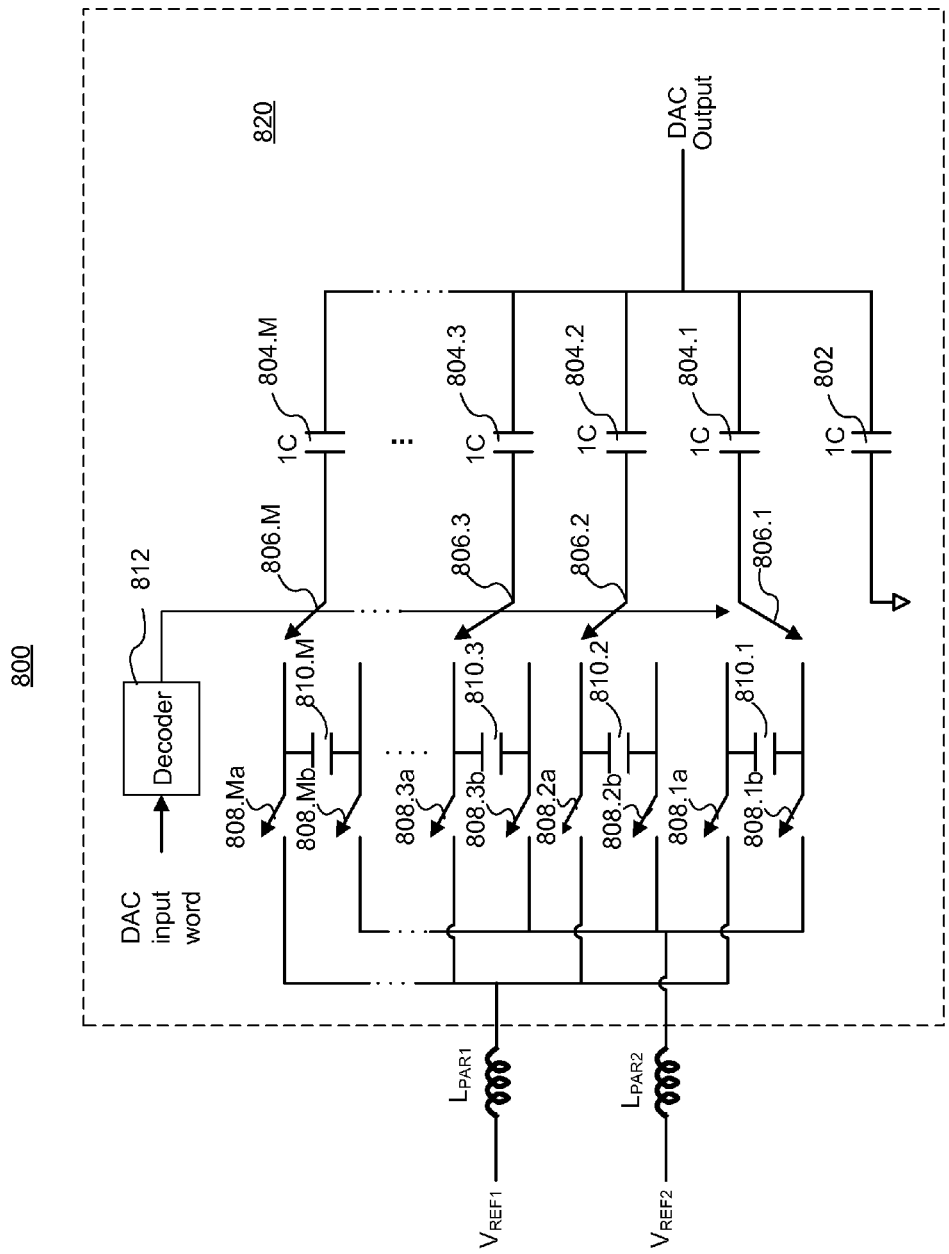
FIG. 8 shows another charge redistribution DAC according to another embodiment of the present invention.

FIG. 8 shows another charge redistribution DAC 800 according to another embodiment of the present invention. The charge redistribution DAC 800 may be a N bit DAC and may comprise a terminating capacitor 802, an array of capacitors 804.1-804.M, a decoder 712 and a plurality of switches 806.1-806.M. The charge redistribution DAC 800 may further comprise a plurality of reservoir capacitors $C_{RES}$ 810.1-810.M. The reservoir capacitors $C_{RES}$ 810.1-810.M each may have a first side (e.g., a first plate or top plate) and a second side (e.g., a second plate or bottom plate) connected to external terminals for the reference voltages $V_{REF1}$ and $V_{REF2}$ via switches 808.1a and 808.1b to 808.Ma and 808.Mb respectively. Each DAC capacitor 804 may be controlled by a respective switch 806 to connect to either the first side or the second side of a respective reservoir capacitor $C_{RES}$ 810. All of these components of the charge redistribution DAC 800, for example, the capacitors (802, 804.1-804.M), switches (806.1-806.M, 808.1a and 808.1b to 808.Ma and 808.Mb), reservoir capacitors $C_{RES}$ (810.1-810.M), may be integrated on an IC chip 820 (e.g., on the same die), and the reservoir capacitors $C_{RES}$ (810.1-810.M) may be on-chip reservoir capacitors. In one embodiment, each capacitor 804 has a unit capacitance and the number M may be equal to $2^N-1$.

The charge redistribution DAC 800 may differ from the charge redistribution DAC 400 by having M ($2^N-1$) capacitors 804.1-804.M each having a unit capacitance, having M switches 806.1-806.M controlled by a decoder 812 that generates control signals by decoding the N bit DAC input word, and having M reservoir capacitors and M pairs of switches 808.1a and 808.1b to 808.Ma and 808.Mb. In one embodiment, the M reservoir capacitors may be sufficiently large and equally sized.

The charge redistribution DAC 800 may operate in two phases, similar to the charge redistribution DAC 400. During the initial action phase, the M pairs of switches 808.1a and 808.1b to 808.Ma and 808.Mb may be closed to let the M reservoir capacitors 810.1-810.M sample the external voltage references $V_{REF1}$ and $V_{REF2}$. During this phase, the witches 806.1-806.M may be connected to or disconnected from the reservoir capacitors $C_{RES}$ 810.1-810.M.

During the second phase, the M pairs of switches 808.1a and 808.1b to 808.Ma and 808.Mb may be opened to disconnect the M reservoir capacitors 810.1-810.M from the external voltage references $V_{REF1}$ and $V_{REF2}$, and thus isolating the charge redistribution DAC 800 from the parasitics. The decoder 812 may generate selection signals for the switches 806.1-806.M based on the DAC input word, as the decoder 712 described above with respect to FIG. 7.

Several embodiments of the present invention are specifically illustrated and described herein. However, it will be appreciated that modifications and variations of the present invention are covered by the above teachings and within the purview of the appended claims without departing from the spirit and intended scope of the invention.

I claim:

1. A charge redistribution digital-to-analog converter (DAC), comprising:
    an on-chip reservoir capacitor having a first plate and a second plate;
    an array of DAC capacitors each having first and second plates;
    an array of switches controlled by an DAC input word to connect a second plate of a respective DAC capacitor to the first or second plate of the on-chip reservoir capacitor;
    a first switch connecting the first plate of the on-chip reservoir capacitor to an external terminal for a first external reference voltage; and
    a second switch connecting the second plate of the on-chip reservoir capacitor to a second external terminal reference voltage.

2. The charge redistribution DAC of claim 1, wherein charge redistribution takes place between the on-chip reservoir capacitor and the DAC capacitors when the DAC input word is applied.

3. The charge redistribution DAC of claim 2, wherein the on-chip reservoir capacitor is one of a plurality of on-chip reservoir capacitors.

4. The charge redistribution DAC of claim 3, wherein the number of on-chip reservoir capacitors is equal to the number of bits of the DAC input word.

5. The charge redistribution DAC of claim 1, wherein during a first phase of operation, the on-chip reservoir capacitor is connected to the external terminals for the reference voltage and ground.

6. The charge redistribution DAC of claim 5, wherein during a second phase of operation, the on-chip reservoir capacitor is disconnected from the external terminals for the reference voltage and ground, and the DAC input word determines whether a respective DAC capacitor is connected to the first plate or the second plate.

7. The charge redistribution DAC of claim 5, wherein the array of DAC capacitors are binary weighted capacitors, a total number of the DAC capacitors is equal to a total number of bits of the DAC input word, and
wherein during the second phase of operation, each bit of the DAC input word determines a corresponding DAC capacitor to be connected to the first or second plate of the on-chip reservoir capacitor.

8. The charge redistribution DAC of claim 5, further comprising a decoder to decode the DAC input word and generate control signals for the array of switches,
wherein each of the DAC capacitors has equal capacitance and a total number of the DAC capacitors is equal to $2^N-1$ with N being an integer larger than one that represents a total number of bits of the DAC input word, and
wherein during the second phase of operation, a number of the DAC capacitors are controlled by the decoder to be connected to the first plate and remaining DAC capacitors to be connected to the second plate of the on-chip reservoir capacitor, the number is equal to a value of the DAC input word.

9. The charge redistribution DAC of claim 5, wherein during the first phase of operation, the DAC capacitors are disconnected from the on-chip reservoir capacitor.

10. The charge redistribution DAC of claim 1, wherein the charge redistribution DAC is in an analog-to-digital converter (ADC).

11. The charge redistribution DAC of claim 10, wherein the ADC is a successive approximation ADC and the on-chip reservoir capacitor samples the reference voltage at the same time that the ADC samples an input voltage.

12. A method of generating a digital-to-analog output for a digital-to-analog converter (DAC), comprising:
sampling an external reference voltage to an on-chip reservoir capacitor of the DAC;
disconnecting the on-chip reservoir capacitor of the DAC from the external reference voltage, and
connecting a plurality of DAC capacitors to the on-chip reservoir capacitor according to a DAC input word.

13. The method of claim 12, wherein charge redistribution takes place between the reservoir capacitor and the DAC capacitors when the DAC input word is applied.

14. The method of claim 12, wherein the on-chip reservoir capacitor is connected to the external reference voltage and ground by two switches, and sampling is performed by closing the two switches.

15. The method of claim 14, wherein the DAC is in a successive approximation analog-to-digital converter (ADC) and the on-chip reservoir capacitor samples the reference voltage at the same time that the ADC samples an input voltage.

16. The method of claim 15, wherein when the on-chip reservoir capacitor of the DAC is disconnected from the external reference voltage, the DAC input word changes among a plurality of values to change redistribution among the on-chip reservoir capacitor and DAC capacitors to generate a plurality of DAC outputs.

17. The method of claim 15, wherein the array of DAC capacitors are binary weighted capacitors, a total number of the DAC capacitors is equal to a total number of bits of the DAC input word, and
wherein when connecting the plurality of DAC capacitors to the on-chip reservoir capacitor, each bit of the DAC input word determines a corresponding DAC capacitor to be connected to a first or second plate of the on-chip reservoir capacitor.

18. The method of claim 15, wherein the DAC further comprises a decoder to decode the DAC input word and generate control signals for the array of switches,
wherein each of the DAC capacitors has equal capacitance and a total number of the DAC capacitors is equal to $2^N-1$ with N being an integer larger than one that represents a total number of bits of the DAC input word, and
wherein when connecting the plurality of DAC capacitors to the on-chip reservoir capacitor, a number of the DAC capacitors are controlled by the decoder to be connected to the first plate and remaining DAC capacitors to be connected to the second plate of the on-chip reservoir capacitor, the number is equal to a value of the DAC input word.

19. The method of claim 12, wherein the plurality of DAC capacitors are kept disconnected form the reservoir capacitor while sampling the external reference voltage to the on-chip reservoir capacitor of the DAC.

20. An analog-to-digital converter (ADC), comprising:
a charge redistribution digital-to-analog converter (DAC), comprising:
an on-chip reservoir capacitor having a first plate and a second plate;
an array of DAC capacitors each having first and second plates;
an array of switches each controlled by an DAC input word to connect a second plate of a respective DAC capacitor to the first or second plate of the on-chip reservoir capacitor;
a first switch connecting the first plate of the on-chip reservoir capacitor to a first external terminal for a first external reference voltage; and
a second switch connecting the second plate of the on-chip reservoir capacitor to a second external terminal for a second external reference voltage.

21. The ADC of claim 20, wherein charge redistribution takes place between the reservoir capacitor and the DAC capacitors when the DAC input word is applied.

22. The ADC of claim 20, the ADC is a successive approximation ADC and the reservoir capacitor samples the reference voltage at the same time that the ADC samples an input voltage.

23. The ADC of claim 20, wherein the DAC capacitors are configured in a split-array.

24. The ADC of claim 20, wherein the array of DAC capacitors are binary weighted capacitors, a total number of the DAC capacitors is equal to a total number of bits of the DAC input word, and
wherein during operation, each bit of the DAC input word controls a corresponding DAC capacitor to be connected to the first or second side of the on-chip reservoir capacitor.

25. The ADC of claim 20, wherein the DAC further comprises a decoder to decode the DAC input word and generate control signals for the array of switches,
wherein each of the DAC capacitors has equal capacitance and a total number of the DAC capacitors is equal to $2^N-1$ with N being an integer larger than one that represents a total number of bits of the DAC input word, and wherein during operation, the DAC capacitors are controlled by the decoder to have a number of them connected to the first side and remaining to be connected to the second side of the on-chip reservoir capacitor, the number is equal to a value of the DAC input word.

26. An integrated circuit (IC) chip, comprising:

a charge redistribution digital-to-analog converter (DAC), comprising:

an on-chip reservoir capacitor having a first plate and a second plate;

an array of DAC capacitors each having first and second plates;

an array of switches controlled by an DAC input word to connect a second plate of a respective DAC capacitor to the first or second plate of the on-chip reservoir capacitor;

a first switch connecting the first plate of the on-chip reservoir capacitor to a first external terminal for a first external reference voltage; and a second switch connecting the second plate of the on-chip reservoir capacitor to a second external terminal for a second external reference voltage.

27. The IC chip of claim 26, wherein charge redistribution takes place between the reservoir capacitor and the DAC capacitors when the DAC input word is applied.

28. The IC chip of claim 26, the ADC is a successive approximation ADC and the reservoir capacitor samples the reference voltage at the same time that the ADC samples an input voltage.

29. The IC chip of claim 26, wherein the DAC capacitors are configured in a split-array.

* * * * *

UNITED STATES PATENT AND TRADEMARK OFFICE
CERTIFICATE OF CORRECTION

| | | |
|---|---|---|
| PATENT NO. | : 8,390,502 B2 | Page 1 of 1 |
| APPLICATION NO. | : 13/069966 | |
| DATED | : March 5, 2013 | |
| INVENTOR(S) | : Kapusta | |

It is certified that error appears in the above-identified patent and that said Letters Patent is hereby corrected as shown below:

In the claims,

In column 8, line 48, change "an DAC input" to --a DAC input--

In column 10, line 26, change "disconnected form the" to --disconnected from the--

In column 10, line 36, change "an DAC input" to --a DAC input--

In column 11, line 15, change "an DAC input" to --a DAC input--

Signed and Sealed this
Thirteenth Day of October, 2015

Michelle K. Lee
*Director of the United States Patent and Trademark Office*